United States Patent [19]

Missele

[11] Patent Number: 5,523,260
[45] Date of Patent: Jun. 4, 1996

[54] METHOD FOR HEATSINKING A CONTROLLED COLLAPSE CHIP CONNECTION DEVICE

[75] Inventor: Carl Missele, Elgin, Ill.

[73] Assignee: Motorola, Inc., Schaumburg, Ill.

[21] Appl. No.: 435,555

[22] Filed: May 5, 1995

Related U.S. Application Data

[63] Continuation of Ser. No. 100,232, Aug. 2, 1993, abandoned.

[51] Int. Cl.$^6$ ................................................. H01L 21/60
[52] U.S. Cl. ........................ 437/209; 437/211; 437/215; 437/217; 437/902
[58] Field of Search ............................... 437/209, 211, 437/215, 217, 220, 902; 257/706, 712, 717, 778

[56] References Cited

U.S. PATENT DOCUMENTS

| | | | |
|---|---|---|---|
| 4,471,837 | 4/1984 | Larson | 165/185 |
| 4,650,922 | 3/1987 | McPherson et al. | 257/712 |
| 4,651,192 | 3/1987 | Matsushita et al. | 257/706 |
| 5,008,757 | 4/1991 | Burnham et al. | 251/712 |
| 5,031,029 | 7/1991 | Acocella et al. | 257/712 |
| 5,038,201 | 8/1991 | Brewer et al. | 257/747 |
| 5,039,628 | 8/1991 | Carey | 437/209 |
| 5,081,067 | 1/1992 | Shimizu et al. | 437/217 |
| 5,200,365 | 4/1993 | Culver | 437/209 |
| 5,224,030 | 6/1993 | Banks et al. | 361/717 |
| 5,229,917 | 7/1993 | Harris et al. | 361/386 |
| 5,390,734 | 2/1995 | Voorhes et al. | 165/185 |

Primary Examiner—Kevin M. Picardat
Attorney, Agent, or Firm—Sue L. Lukasik; Nedra A. Karim; Daniel C. Crilly

[57] ABSTRACT

A controlled collapse chip connection device can be heat sinked in the following manner. A carbon composition heat sink (102) having a thermal expansion coefficient substantially equal to a thermal expansion coefficient of the controlled collapse connection chip device (101) is positioned in a proximate location to a fabricated thermal mating area (104) of the controlled collapse chip connection device (101). The carbon composition heat sink (102) is then thermally bonded to the thermal mating area (104) of the controlled collapse connection chip device (101).

9 Claims, 1 Drawing Sheet

METHOD FOR HEATSINKING A CONTROLLED COLLAPSE CHIP CONNECTION DEVICE

This is a continuation of application Ser. No. 08/100,232, filed Aug. 2, 1993 and now abandoned.

FIELD OF THE INVENTION

This invention generally relates to heat sinking devices and, in particular, to heat sinking controlled collapse chip connection devices.

BACKGROUND OF THE INVENTION

Controlled collapse chip connection devices (flip chip) are known to have poor thermal paths to dissipate generated heat. To compensate for this, prior art heat sinking methods utilized metallic heat sinks placed in proximate locations to the flip chip via a thermal contact, such as a spring. Metallic heat sinks cannot be directly bonded to a flip chip because the metallic heat sinks have a high thermal expansion coefficient in comparison to the thermal expansion coefficient of the flip chip. If a metallic heat sink is directly bonded to a flip chip, undue stress is put on the flip chip as each part expands and contracts with heating and cooling. This stress can cause damage to the flip chip and render it inoperable.

One method to obtain physical contact between a metallic heat sink and a flip chip uses a thermal compound composed of a slippery material with thermally conducting particles. However, this method is not as thermally conductive as desirable because the thermal compound is typically 10 to 20 times less thermally conductive than solder.

Therefore, a need exists for a method of heat sinking a flip chip that eliminates undue stress on the flip chip due to different expansion coefficients and provides direct thermal coupling between a heat sink and the flip chip.

DESCRIPTION OF A PREFERRED EMBODIMENT

Figure 1:
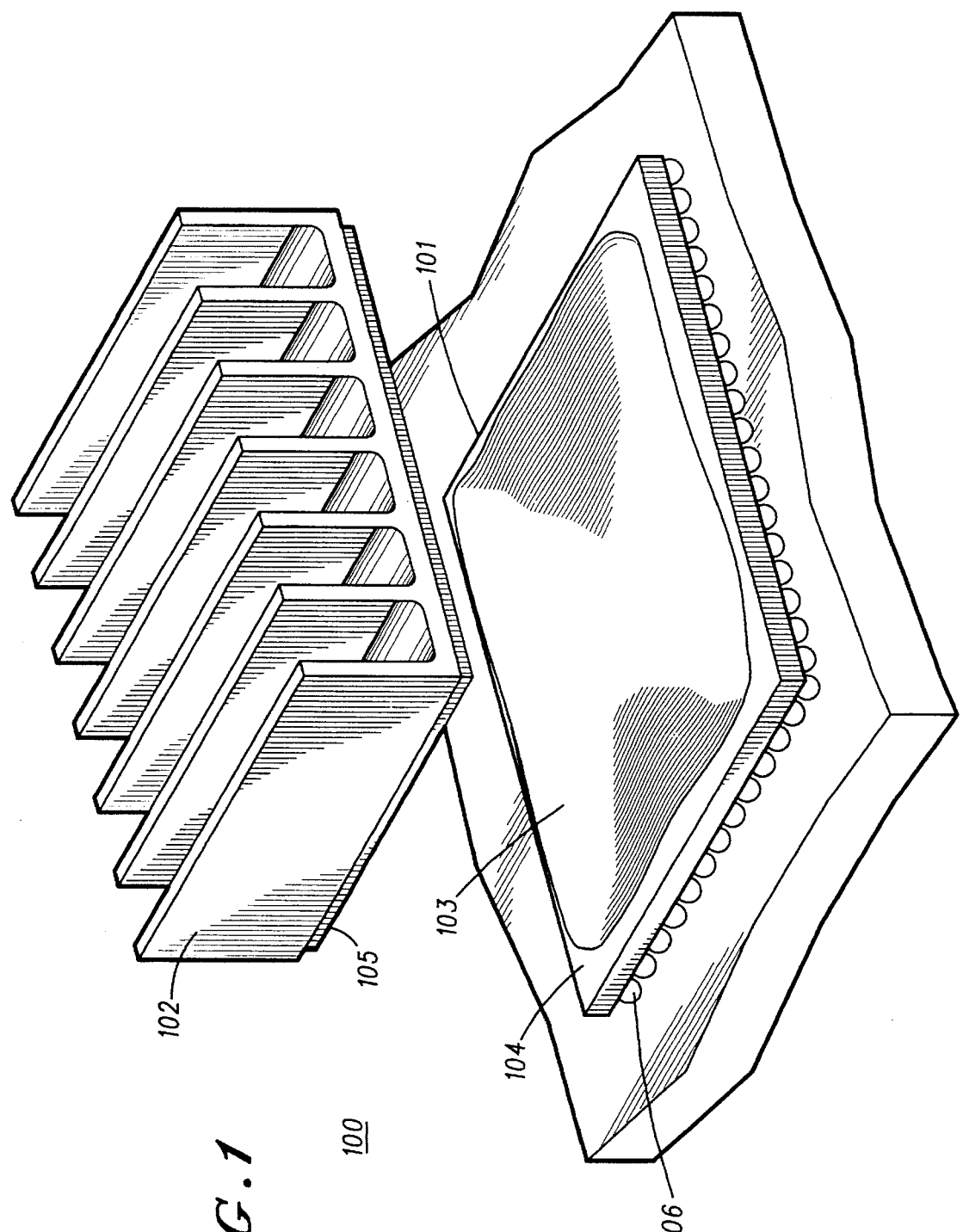
FIG. 1 illustrates a heat sinked assembly in accordance with the present invention.

Generally, the present invention provides a method for heat sinking a controlled collapse chip connection device (flip chip). This is accomplished by thermally and mechanically coupling a carbon composition heat sink to the flip chip. The carbon composition heat sink is fabricated to have a thermal expansion coefficient that substantially matches the thermal expansion coefficient of the flip chip. By having the thermal expansion coefficients match, the heat sink can be directly bonded to the flip chip with minimal risk of thermal expansion damage. Thus, the present invention provides improved thermal dissipation due to the direct contact which could not be obtained with a prior art metallic heat sink.

The present invention can be more fully described with reference to FIG. 1. FIG. 1 illustrates a heat sinked assembly (100) that includes a controlled collapse chip connection device (flip chip) (101), a heat sink (102), and a bonding agent (103). The flip chip (101) further includes a thermal mating area (104), while the heat sink (102) further includes a solderable pattern (105). The flip chip (101) may be a simple integrated circuit or a complex microprocessor which has been "bumped" with solder spheres (106) for attachment to a circuit board. The solder spheres (106) and the back of the flip chip (101) are the only thermal paths for heat dissipated by the flip chip (101) without a heat sink. Since the solder spheres (106) are small and usually located in inactive areas of the chip, the back side of the device offers the best location for a thermal management device (heat sink). Bonding a metallic heat sink (102) directly to the back of the flip chip (101) could result in damage to the flip chip (101) or to the solder connections to the circuit board due to the stresses arising from the expansion differences between the metallic sink and the silicon or gallium arsenide composition of the flip chip.

Due to the thermal expansion properties of the flip chip (101), the heat sink (102) is composed of a carbon composition due to the thermal properties of such compositions. The carbon composition may be comprised of graphite or carbon/carbon composite materials. Carbon based materials have inherently low expansion coefficients ranging from slightly negative to 6 to 10 parts per million per degree Celsius (ppm/° C). The expansion of graphite materials can be tailored as desired by adding metallic powders in various quantities. For porous graphite, vacuum filling with plastics such as polystyrene, phenolic, or other organic compounds will also provide expansion control. For carbon based materials, carbon fibers may be added as a "cloth" or as random fibers. Depending on the direction of the fibers, in the case of the carbon cloth, the expansion will vary and can be matched to that of the silicon.

Silicon has an expansion coefficient of 2.7 ppm/° C., while gallium arsenide has an expansion coefficient of 6.9 ppm/° C. As the power dissipation of the flip chip (101) increases, it is desirable to attach a heat sink (102) with high thermal conductivity directly to the flip chip. As the flip chip (101) increases in size, it becomes increasingly more important for any heat sink attached to the flip chip to match the expansion of the silicon or gallium arsenide. Since the carbon based materials meet that criteria, it is possible to directly attach the carbon based heat sink (102) to the back of the flip chip (101) with solder or with a conductive epoxy without affecting reliability adversely.

To create the heat sinked assembly (100), the solderable pattern (105) of the heat sink (102) is proximately located to the thermal mating area (104) of the flip chip (101) and bonded via the bonding agent (103). The solderable pattern (105) may be flame sprayed copper with a tin overplate, electroplated copper, fired on tin/chrome, or a solderable polymer. The thermal mating area (104) of the flip chip (101) may be sputtered chrome/copper/gold and would be applied to entire backside of the silicon or gallium arsenide wafer before the wafer is diced into chips. With solderable patterns (105) on the heat sink (102) and the flip chip (101), the bonding agent (103) is solder. The soldering processes may be accomplished by using a solder preform or by dispensing or screening solder paste on the heat sink (102). The heat sink (102) might be applied to the flip chip (101) prior to placing the flip chip (101) on a circuit board. The solder attachment would be made to the flip chip (101) by heating the two parts in contact with each other. Since the solder spheres (106) on the flip chip (101) are typically a high melting temperature alloy, these would not be affected by the process. Attachment of the flip chip (101) to the circuit board would be accomplished by melting the low temperature solder on the circuit board to attach to the higher temperature solder spheres (106) on the flip chip (101). If the solder attaching the heat sink (102) to the flip chip (101) melts, it will not affect the performance of the heat sink (102).

An alternative to soldering the heat sink (102) to the flip chip (101) is to use a thermal epoxy and glue it. While thermal epoxies do not have the same thermal properties as solder, if kept relatively thin, they will not affect the overall thermal performance substantially. The epoxy may be screened or dispensed on the heat sink (102) and then carefully positioned over the back of the flip chip (101) for attachment. It is important to position the parts well since there is no self alignment as occurs with soldering. In this case, the attachment of the heat sink (102) is done after the flip chip (101) has been soldered to the circuit board. Often, an underfill epoxy is used to distribute the stress generated by the expansion differences between the flip chip (101) and the circuit board. The curing of that material and the heat sink epoxy may be combined.

The present invention provides a method for heat sinking a controlled collapse chip connection device (flip chip). By using a carbon composition heat sink, the heat sink can be directly bonded to the flip chip, thus providing improved thermal coupling over prior art metallic heat sinking methods. In addition to the improved thermal coupling, the present invention eliminates the risk of thermal stress fractures to the flip chip as a result of different thermal expansion coefficients between the flip chip and the heat sink which would result with the prior art metallic heat sinks.

I claim:

1. A method for heat sinking a controlled collapse chip connection device, the method comprising the steps of:

a) fabricating a thermal mating area on the controlled collapse chip connection device;

b) combining graphite and an organic compound to produce a graphite composite heat sink that has a thermal expansion coefficient that substantially matches a thermal expansion coefficient of the controlled collapse chip connection device;

c) positioning the graphite composite heat sink in a proximate location to the thermal mating area of the controlled collapse chip connection device; and d) thermally bonding the graphite composite heat sink to the thermal mating area.

2. The method of claim 1, wherein step (a) further comprises the step of fabricating the thermal mating area in a solderable pattern.

3. The method of claim 2, further comprising the step of matching the solderable pattern of the thermal mating area with a solderable pattern of the graphite heat sink to produce matched solderable patterns.

4. The method of claim 3, further comprising the step of soldering the graphite heat sink to the thermal mating area via the matched solderable patterns.

5. The method of claim 1, wherein the thermal bonding of step (d) further comprises the step of using an epoxy composition to thermally bond the graphite heat sink to the thermal mating area.

6. The method of claim 1, wherein the organic compound is polystyrene or phenolic.

7. The method of claim 1, wherein step (b) comprises the step of vacuum filling the graphite with the organic compound to produce the graphite composite heat sink.

8. The method of claim 1, wherein the controlled collapse chip connection device comprises a silicon composition.

9. The method of claim 1, wherein the controlled collapse chip connection device comprises a gallium arsenide composition.

* * * * *